(12) United States Patent
Saha et al.

(10) Patent No.: US 7,409,418 B2
(45) Date of Patent: Aug. 5, 2008

(54) LINEARLY SCALABLE FINITE IMPULSE RESPONSE FILTER

(75) Inventors: Kaushik Saha, Delhi (IN); Srijib N. Maiti, Midnapore (IN)

(73) Assignee: STMicroelectronics PVT. Ltd., Noida (IN)

( * ) Notice: Subject to any disclaimer, the term of this patent is extended or adjusted under 35 U.S.C. 154(b) by 811 days.

(21) Appl. No.: 10/715,133

(22) Filed: Nov. 17, 2003

(65) Prior Publication Data

US 2004/0153487 A1    Aug. 5, 2004

(30) Foreign Application Priority Data

Nov. 18, 2002    (IN) .................. 1166/DEL/2002

(51) Int. Cl.
*G06F 17/10*    (2006.01)
(52) U.S. Cl. ...................... 708/319; 708/303
(58) Field of Classification Search ............. 708/303, 708/319, 324
See application file for complete search history.

(56) References Cited

U.S. PATENT DOCUMENTS

| | | | | |
|---|---|---|---|---|
| 4,541,048 | A * | 9/1985 | Propster et al. | ............... 712/32 |
| 5,081,604 | A * | 1/1992 | Tanaka | ....................... 708/319 |
| 5,297,069 | A | 3/1994 | Asato et al. | |
| 5,594,679 | A * | 1/1997 | Iwata | ......................... 708/521 |
| 5,732,004 | A | 3/1998 | Brown | |
| 6,061,521 | A * | 5/2000 | Thayer et al. | .................. 712/9 |
| 6,260,053 | B1 | 7/2001 | Maulik et al. | |
| 6,308,191 | B1 | 10/2001 | Gay-Bellile | |
| 6,546,407 | B2 * | 4/2003 | Jiang et al. | .................. 708/313 |
| 6,571,268 | B1 * | 5/2003 | Giacalone et al. | ........... 708/524 |
| 2003/0065693 | A1* | 4/2003 | Nothlings et al. | ........... 708/319 |

FOREIGN PATENT DOCUMENTS

| | | |
|---|---|---|
| EP | 0285316 | 10/1988 |
| EP | 0818740 | 1/1998 |

OTHER PUBLICATIONS

Dick "The Scalability of Linear Filters on Hypercube Concurrent Computers", Signals, Systems and Computers 1994, IEEE Comput. Soc. US., Oct. 31, 1994, pp. 1069-1073.
Wilkenson "Digital System Design," 1987, Pretiss-Hall International, pp. 460-463 and 472-473.
Datasheet—TMS320C30 Digital Signal Processor, Texas Instruments, 1997.
Slump "Designand Implementation of a Linear-phase Equalizer in Digital Audio Signal Processing": IEEE Workshop on VLSI Signal Processing V, Oct. 28, 1992, pp. 297-306.
Mou "Fast FIR Filtering: Algorithms and Implementations" Signal Processing, Amsterdam, NL, vol. 13, Dec. 1987 pp. 377-384.

(Continued)

*Primary Examiner*—Tan V. Mai
(74) *Attorney, Agent, or Firm*—Gardere Wynne Sewell LLP

(57) ABSTRACT

An improved Finite Impulse Response (FIR) filter is presented which provides linear scalability and implementation without the need for delay lines. A multiprocessor architecture includes a plurality of ALUs (Arithmetic and Logic Unit), Multipliers units, Data cache, and Load/Store units sharing a common Instruction cache. A multi-port memory is also included. An assigning functionality assigns to each available processing unit the computation of specified unique partial product terms and the accumulation of each computed partial product on specified output sample values.

10 Claims, 5 Drawing Sheets

$$
\begin{aligned}
y(0) &= x(0)h(0) \\
y(1) &= x(1)h(0) + x(0)h(1) \\
y(2) &= x(2)h(0) + x(1)h(1) + x(0)h(2) \\
y(3) &= x(3)h(0) + x(2)h(1) + x(1)h(2) + x(0)h(2) \\
y(4) &= x(4)h(0) + x(3)h(1) + x(2)h(2) + x(1)h(2) + x(0)h(1) \\
y(5) &= x(5)h(0) + x(4)h(1) + x(3)h(2) + x(2)h(2) + x(1)h(1) + x(0)h(0) \\
y(6) &= x(6)h(0) + x(5)h(1) + x(4)h(2) + x(3)h(2) + x(2)h(1) + x(1)h(0) \\
y(7) &= x(7)h(0) + x(6)h(1) + x(5)h(2) + x(4)h(2) + x(3)h(1) + x(2)h(0) \\
y(8) &= x(8)h(0) + x(7)h(1) + x(6)h(2) + x(5)h(2) + x(4)h(1) + x(3)h(0) \\
y(9) &= x(9)h(0) + x(8)h(1) + x(7)h(2) + x(6)h(2) + x(5)h(1) + x(4)h(0) \\
y(10) &= x(10)h(0) + x(9)h(1) + x(8)h(2) + x(7)h(2) + x(6)h(1) + x(5)h(0)
\end{aligned}
$$

OTHER PUBLICATIONS

European Search Report, for EP 03104135, dated Jul. 14, 2004.
Eyre, "The Evolution of DSP Processors" IEEE Signal Processing Magazine, Mar. 2000.
Sernec, "The Evolution of DSP Architectures: Towards Parallelism Exploitation" 10th Mediterranean Electrotechnical Conference, 2000, vol. II pp. 782785.
Mou "A Study of VLSI Symmetric FIR Filter Structures" Journal of VLSI Signal Processing 4, Nov. 1992.
Deka, "A Comprehensive Study of Digital Signal Processing Devices" Microprocessors and Microsystems, vol. 19, No. 4 May 1995.

* cited by examiner $y(0) = x(0)h(0)$
$y(1) = x(1)h(0) + x(0)h(1)$
$y(2) = x(2)h(0) + x(1)h(1) + x(0)h(2)$
..........................
..........................
$y(H-1) = x(H-1)h(0) + x(H-2)h(1) + x(H-3)h(2) + ........... +x(0)h(H-1)$      ----saturation from this point onwards $y(H) = x(H)h(0) + x(H-1)h(1) + x(H-2)h(2) + ........... +x(1)h(H-1)$
$y(H+1) = x(H+1)h(0) + x(H)h(1) + x(H-1)h(2) + .......... +x(2)h(H-1)$
..........................
..........................
$y(N-1) = x(N-1)h(0) + x(N-2)h(1) + x(N-3)h(2) + ..... +x(N-H+1)h(H-1)$

Figure 1

$$
\begin{aligned}
y(0) &= x(0)h(0) \\
y(1) &= x(1)h(0) + x(0)h(1) \\
y(2) &= x(2)h(0) + x(1)h(1) + x(0)h(2) \\
y(3) &= x(3)h(0) + x(2)h(1) + x(1)h(2) + x(0)h(2) \\
y(4) &= x(4)h(0) + x(3)h(1) + x(2)h(2) + x(1)h(2) + x(0)h(1) \\
y(5) &= x(5)h(0) + x(4)h(1) + x(3)h(2) + x(2)h(2) + x(1)h(1) + x(0)h(0) \\
y(6) &= x(6)h(0) + x(5)h(1) + x(4)h(2) + x(3)h(2) + x(2)h(1) + x(1)h(0) \\
y(7) &= x(7)h(0) + x(6)h(1) + x(5)h(2) + x(4)h(2) + x(3)h(1) + x(2)h(0) \\
y(8) &= x(8)h(0) + x(7)h(1) + x(6)h(2) + x(5)h(2) + x(4)h(1) + x(3)h(0) \\
y(9) &= x(9)h(0) + x(8)h(1) + x(7)h(2) + x(6)h(2) + x(5)h(1) + x(4)h(0) \\
y(10) &= x(10)h(0) + x(9)h(1) + x(8)h(2) + x(7)h(2) + x(6)h(1) + x(5)h(0)
\end{aligned}
$$

Figure 2

$y(0) = x(0)h(0)$
$y(1) = x(1)h(0) + x(0)h(1)$
$y(2) = x(2)h(0) + x(1)h(1) + x(0)h(2)$
$y(3) = x(3)h(0) + x(2)h(1) + x(1)h(2) + x(0)h(3)$ ← No reusability
$y(4) = x(4)h(0) + x(3)h(1) + x(2)h(2) + x(1)h(3) + x(0)h(2)$
↓1 $y(5) = x(5)h(0) + x(4)h(1) + x(3)h(2) + x(2)h(3) + x(1)h(2) + x(0)h(1)$
$y(6) = x(6)h(0) + x(5)h(1) + x(4)h(2) + x(3)h(3) + x(2)h(2) + x(1)h(1) + x(0)h(0)$ ↓2 $y(7) = x(7)h(0) + x(6)h(1) + x(5)h(2) + x(4)h(3) + x(3)h(2) + x(2)h(1) + x(1)h(0)$
$y(8) = x(8)h(0) + x(7)h(1) + x(6)h(2) + x(5)h(3) + x(4)h(2) + x(3)h(1) + x(2)h(0)$
$y(9) = x(9)h(0) + x(8)h(1) + x(7)h(2) + x(6)h(3) + x(5)h(2) + x(4)h(1) + x(3)h(0)$
$y(10) = x(10)h(0) + x(9)h(1) + x(8)h(2) + x(7)h(3) + x(6)h(2) + x(5)h(1) + x(4)h(0)$
$y(11) = x(11)h(0) + x(10)h(1) + x(9)h(2) + x(8)h(3) + x(7)h(2) + x(6)h(1) + x(5)h(0)$
$y(12) = x(12)h(0) + x(11)h(1) + x(10)h(2) + x(9)h(3) + x(8)h(2) + x(7)h(1) + x(6)h(0)$

Figure 3

LINEARLY SCALABLE FINITE IMPULSE RESPONSE FILTER

PRIORITY CLAIM

The present application claims priority from Indian Patent Application No. 1166/Del/2002 filed Nov. 18, 2002, the disclosure of which is hereby incorporated by reference.

BACKGROUND OF THE INVENTION

1. Technical Field of the Invention

The present invention relates to Finite Impulse Response (FIR) Digital Filters. More specifically the invention relates to an efficient implementation for Finite Impulse Response filters in a multi-processor architecture.

2. Description of Related Art

Finite Impulse Response (FIR) filters are an important and widely used form of a digital filter. FIR filters are used in numerous real time applications including telecommunication, particularly for the generation of constant phase delay characteristics. In addition, signal processing applications requiring an interpolation and decimation function incorporate FIR filtration as an integral part of the process.

The output sample of a FIR filter is a convolution summation of input samples and the impulse response of the filter. The output, y(n) of a causal FIR filter can be written as:

$$y(n) = \sum_{k=0}^{H-1} h(k) * x(n-k)$$

Where:
H is the total number of filter coefficients and n=0, 1, 2, 3 ... for different values of n, the output sample of the filter can be obtained;
h(k) is the impulse response of the filter. Filter coefficients are determined for various values of k. The value of k can never be negative for a causal system; and
x(m) is the input sample, m=n−k as shown in the equation above. The value of m can never be negative for a causal system.
As stated by the above equation, the coefficients are multiplied with the appropriate input samples and summed (i.e., accumulated) for obtaining a particular output sample. For N number of input samples and H number of coefficients, the required number of multiplications for a given output sample is H. The saturation point occurs at the Hth output sample as shown in FIG. 1. The H number of multiplications are necessarily required if all the H coefficients are unique.

Compared to other filters, FIR filters offer the following advantages: FIR filters are simple to implement and design. Linear-phase filters that delay the input signal, without causing phase distortion, can be easily realized using FIR filters. FIR filters do not employ any feedback and hence present fewer difficulties in practical implementation. The absence of feedback also simplifies design by making it possible to use finite precision arithmetic. Multi-rate applications such as "decimation" (reducing the sampling rate), "interpolation" (increasing the sampling rate), can be realized best by FIR filters.

FIR filters can be easily implemented using fractional arithmetic unlike other types of filters in which it is difficult to do so. It is always possible to implement a FIR filter using coefficients with a magnitude of less than 1.0 as the overall gain of the FIR filter can be adjusted at its output. All the above advantages make FIR filters preferable for fixed-point Digital Signal Processors (DSPs).

The conventional approach of FIR filter implementation utilizes a delay line (m=n−k, as in the equation above), resulting in increased memory requirements and slower computation.

U.S. Pat. No. 5,732,004 describes an algorithm for FIR filtering. It proposes a method of decimating and/or interpolating a multi-bit input signal in which n/2 additions are performed, where 'n' is the number of bits in each filter coefficient. Scaling and multiplication of data with coefficients is performed using standard DSP architecture using coefficient values and associated scaling factors stored in memory. The coefficients are stored in coded form, and are then decoded prior to multiplication by the data values. A delay line is essential for the implementation of this method.

U.S. Pat. Nos. 6,260,053 and 5,297,069 describe methods and implementations that utilize delay lines for FIR filter implementation. Moreover, none of these methods provides linear scalability.

SUMMARY OF THE INVENTION

There is a need in the art to provide an efficient implementation for FIR filter for multi-processor architectures.

There is also a need to provide a linearly scalable FIR filter.

There is still further a need to obviate the need of a delay line for implementing an FIR filter thereby reducing the memory requirement for computation and resulting in a cost effective solution.

There is also a need to speed up the computation of FIR filters.

To address one or more of these needs, embodiments of the present invention are directed to an improved Finite Impulse Response (FIR) filter providing linear scalability and implementation without the need for delay lines. The FIR filter comprises a multiprocessor architecture including a plurality of ALUs (Arithmetic and Logic Unit), Multipliers units, Data cache, and Load/Store units sharing a common Instruction cache. A multi-port memory is also included. An assigning means assigns to each available processing unit the computation of specified unique partial product terms and the accumulation of each computed partial product on specified output sample values.

The assigning means is a pre-process that is used to design the implementation of the FIR filter based on the filter specifications.

Further the invention also provides a method for implementing an improved Finite Impulse Response (FIR) filter providing linear scalability using a multiprocessing architecture platform without the need for delay lines, comprising:
 assigning to each available processing unit the computation of specified unique partial product terms; and
 accumulating each computed partial product on specified output sample values.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 shows a generalized set of equations for the outputs of an FIR filter with N input/output samples, and H filter coefficients;

FIG. 2 shows a set of equations for the outputs of a FIR filter having 11 input/output samples, and 6 filter coefficients;

FIG. 3 shows a set of equations for the outputs of an FIR filter having 13 input/output samples, and 7 filter coefficients;

DETAILED DESCRIPTION OF THE DRAWINGS

Figure 4:
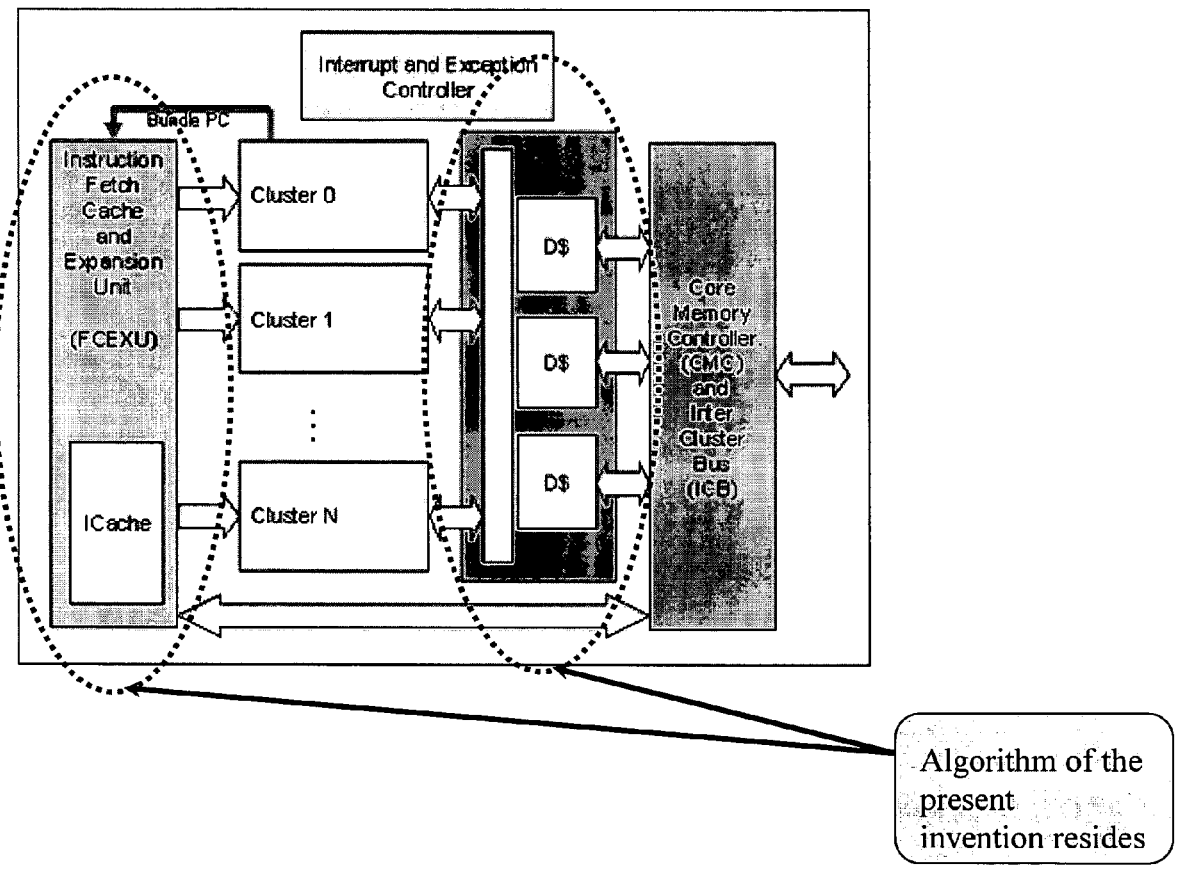
FIG. 4 shows a schematic diagram of a Multi-processor architecture.

FIG. 1 shows a generalized set of equations for the outputs of an FIR filter with N input/output samples, and H filter coefficients. These equations define the outputs from an FIR filter.

FIG. 2 refers to an example of the output samples of a symmetric FIR filter having 11 input/output samples, and 6 filter coefficients. If the total number of coefficients 'H' is an even number as shown in this example, then it is possible to obtain all the output samples by computing a subset of partial products that involve 'H/2' coefficients. Each of these partial products occurs in 2 symmetrically spaced samples, and can therefore be computed once and reused thereby eliminating the requirement of a delay line and reducing computational time and memory space requirements, as compared to the conventional approach of FIR filter implementation.

In the example of FIG. 2 output sample y(5) requires the computation of only 3 partial products, i.e., x(5)h(0), x(4)h(1) and x(3)h(2), as the other three partial product terms, x(0)h(0), x(1)h(1) and x(2)h(2), have already been computed in previous samples y(0), y(2) and y(4), respectively. Similarly, x(5)h(0), x(4)h(1) and x(3)h(2), contribute to terms y(10), y(8) and y(6), respectively, and so on. It can be observed from FIG. 2 that 'P' number of consecutive output calculations can be distributed over 'P' processors simultaneously, provided 'P' consecutive inputs are present. As shown for the case of two processors (P=2), y(5) and y(6) can be calculated simultaneously.

FIG. 3 shows an example of the output samples of a symmetrical FIR filter having 13 input/output samples, and 7 filter coefficients. If the total number of coefficients 'H' is an odd number as shown in this example, then it is possible to obtain all the output sample by calculating a maximum ((H−1)/2+1) number of partial products after the saturation. When the filter coefficient are odd, i.e., H is odd, the basic algorithm remains the same as for the even number of coefficients case with the exception for the ((H−1)/2+1)th column around which the FIG. 3 is centro-symmetric. The total number of the required multiplications for each output sample is ((H−1)/2+1) after the saturation. As shown, the product term associated with h(3) can not be reused to calculate the partial summation for any other output sample.

The basic algorithm for symmetric FIR filter computation is as follows:
  initialize loop index by zero;
  load input sample and coefficients;
  multiply input sample and coefficient;
  update current output;
  update partial output, if required (see Note below);
  increment loop index by Number of processor; and
  if loop termination is condition satisfied then stop, else go to second step.

Note: for Centro-symmetric case one product term is never re-used.

For the case of a 2 parallel-processor architecture the basic algorithm is modified as follows:

initialize loop-index by zero;
  load input sample for processor #1;
  load coefficient for processor #1;
  multiply input sample and coefficient in processor #1;
  update current output in processor #1;
  update partial output, if required, in processor #1;
  load input sample for processor #2;
  load coefficient for processor #2;
  multiply input sample and coefficient in processor #2;
  update current output in processor #2;
  update partial output, if required, in processor #2;
  increment loop-index by 2; and
  if loop-index equals to (N*H) then stop, or go to second step.

The algorithm can be generalized for any number of processors in parallel.

Further the algorithm is also applicable for the asymmetric FIR Filters in following steps:
  initialize loop index by zero;
  load input sample and coefficients;
  multiply input sample and coefficient;
  update current output;
  increment loop index by Number of processor; and
  if loop termination is condition satisfied then stop, else go to second step.

Each processor in the parallel processing architecture is provided with an independent ALU (Arithmetic and Logic Unit), Multiplier unit, Data cache, and Load/Store unit. All the processors share a common Instruction cache, and multi-port memory. This architecture is typical of VLIW (Very Large Instruction Word) processors.

FIG. 4 shows the typical architecture of a Very Long Instruction Word (VLIW) processor core. It is a Multi-processor architecture in which each processor is composed of a mix of Register Banks, Constant Generators (immediate operands) and Functional Units. Different processors may have different unit/register mixes, but a single Program Counter and a unified I-cache controls them all, so that all processors run in lockstep (as expected in a VLIW). Similarly, the execution pipeline drives all processors. Inter-processor communication, achieved by explicit register-to-register move, is compiler-controlled and invisible to the programmer. At the multi-processor level, the typical architecture specification for such a device is as follows:
  an instruction delivery mechanism is provided to get instructions from the cache to the processors' data-path;
  an inter-processor communication mechanism is provided to transfer data among processors; and
  the data-cache is organized to establish a guarantee of main memory coherency in the presence of multiple memory accesses.

The Algorithm to compute output samples resides in the instruction fetch cache and expansion unit.

Figure 5:
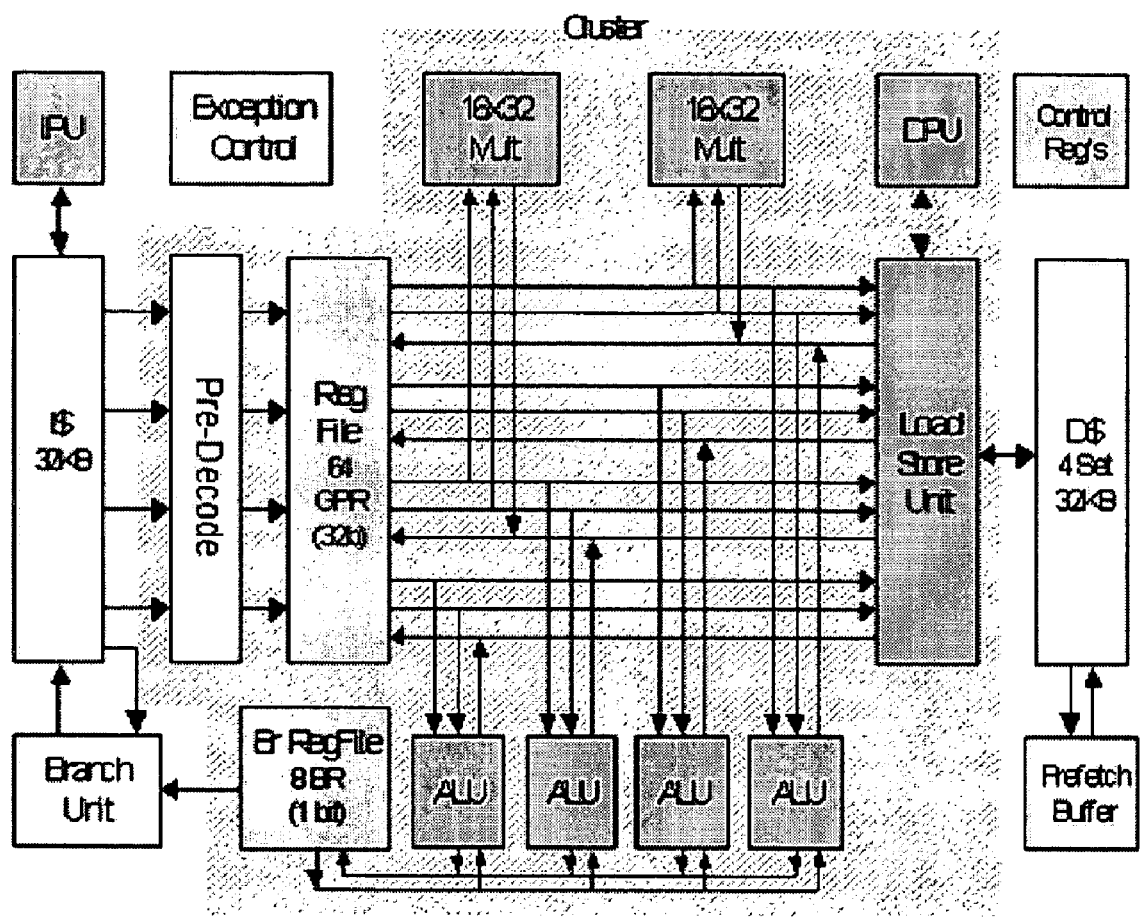
FIG. 5 shows a schematic diagram of the internal architecture of one processor of a multi-processor architecture.

FIG. 5 shows the schematic diagram of the internal architecture of the processor. Generally a processor is a 4-issue (maximum 4 instructions can be issued simultaneously) VLIW core comprising the following:
  four 32-bit integer ALUs, two 16×32 multipliers, one Load/Store Unit and one Branch Unit; and
  sixty four 32-bit General-purpose registers and 8 1-bit branch registers (used to store branch condition, predicates and carries). Instructions allow two long immediate data operands per cycle.

The Instruction Set Architecture is a very simple integer RISC instruction set with minimal "predication" support through select instructions.

The memory-addressing repertoire includes base+offset addressing, allows speculative execution (dismissible loads, handled by the protection unit) and software pre-fetching.

The instant invention utilizes this architecture to provide faster computation as it is evident from the fact that, if any FIR filter takes T units of time to compute N outputs in one processor, then for the increased number of processors (say P), the time required to compute N outputs will be T/P units of time, which provides 'Linear scalability'. Further, since all the processors load input samples and coefficients from the shared memory where both the data are available, there is no requirement for any delay line. The instant invention does not limit its scope to non-unique filter coefficients, but both the non-utilization of delay line as well as linear scalability can be realized for all unique coefficients.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A symmetric Finite Impulse Response (FIR) filter providing linear scalability, comprising:
    a multiprocessor architecture wherein each processor includes an ALU (Arithmetic and Logic Unit), a Multiplier unit, Data cache, and Load/Store unit, the multiprocessor architecture sharing a common Instruction cache and a multi-port memory, and
    assigning means for assigning to each processor the computation of specified unique FIR partial product terms and the accumulation of computed partial product terms without the need for delay lines in order to generate filtered output sample values.

2. A method for symmetric Finite Impulse Response (FIR) filtering of input data providing linear scalability using a multiprocessor architecture platform, comprising:
    assigning to each processor the computation of specified unique FIR partial product terms and the accumulation of computed partial product terms without use of a delay line to generate filtered output values.

3. The method of claim 2 wherein the multiprocessor architecture comprises a two processor architecture, the method comprising:
    initializing a loop-index by zero;
    loading an input data term for a first processor;
    loading a filter coefficient for the first processor;
    multiplying the input data term and filter coefficient in the first processor;
    updating a current output in the first processor;
    updating a partial output, if required, in the first processor;
    loading an input data term for a second processor;
    loading a filter coefficient for the second processor;
    multiplying the input data term and filter coefficient in the second processor;
    updating a current output in the second processor;
    updating a partial output, if required, in the second processor;
    increment the loop-index by 2; and
    stopping if the loop-index equals end, else, returning to loading the input data term for the first processor and repeating.

4. The method of claim 2, comprising:
    Initializing a loop index by zero;
    loading an input data term and filter coefficients;
    multiplying the input data term and filter coefficient;
    updating a current output;
    updating a partial output, if required;
    incrementing the loop index; and
    if loop termination is condition satisfied then:
        stopping; else
        returning to loading an input data term and filter coefficients and repeating.

5. The method of claim 2, comprising:
    initializing a loop index by zero;
    loading an input data term and filter coefficients;
    multiplying the input data term and filter coefficient;
    updating a current output;
    incrementing the loop index by a number of processors being used for the computation; and
    if a loop termination condition satisfied then:
        stopping;
        else, returning to loading an input data term and filter coefficients and repeating.

6. A finite impulse response (FIR) filter architecture, comprising:
    a plurality of processors arranged in a parallel processing architecture wherein the processors share a common instruction cache and memory, the memory storing a stream of input data to be filtered and filtering coefficients for implementing the FIR filter;
    an execution program that distributes computational load for FIR filtering of the input data across the plurality of processors by assigning to each processor for a given term of the input data from the stream the computation of certain specified unique partial product terms and the accumulation of computed partial products for that input data to generate output sample values;
    wherein the partial product terms comprise a product of a certain one of a plurality of FIR filter coefficients and the given term of the input data.

7. The architecture of claim 6 wherein partial product terms computed during a given computation iteration are reused during a later computation iteration.

8. The architecture of claim 7 wherein the computed partial product terms are stored in the shared memory after use during the given computation iteration and later retrieved therefrom by the processors for use during the later computation iteration.

9. A symmetric Finite Impulse Response (FIR) filter providing linear scalability, comprising:
    a multiprocessor architecture wherein each processor includes an ALU (Arithmetic and Logic Unit), a Multiplier unit, Data cache, and Load/Store unit, the multiprocessor architecture sharing a common Instruction cache and a multi-port memory, and
    assigning means for distributing computational load for the FIR filtering of input data across the multiprocessor architecture by assigning to each processor the computation of specified unique partial product terms and the accumulation of computed partial product terms to generate filtered output sample values;
    wherein the partial product terms comprise a product of a certain one of a plurality of filter coefficients and a certain term of the input data, computed partial product terms from one computation iteration being reused by the processors in a subsequent computation iteration; and
    wherein each processor in the multiprocessor architecture has access to all terms of the input data and all of the filter coefficients which are stored in the multi-port memory.

10. A method for symmetric Finite Impulse Response (FIR) filtering of input data providing linear scalability using a multiprocessor architecture platform, comprising:

storing in a memory shared by plural processors in the multiprocessor architecture platform all terms of the input data to be FIR filtered and all filter coefficients;

distributing computational load for the FIR filtering of input data across the multiprocessor architecture platform by assigning to each processor the computation of specified unique partial product terms and the accumulation of computed partial product terms to generate filtered output sample values;

reusing by the processors of computed partial product terms from one computation iteration in a subsequent computation iteration;

wherein the partial product terms comprise a product of a certain one of the filter coefficients and a certain term of the input data.

* * * * *